United States Patent
Hagiwara et al.

(10) Patent No.: US 6,780,551 B2
(45) Date of Patent: Aug. 24, 2004

(54) CHARGED PARTICLE PROCESSING FOR FORMING PATTERN BOUNDARIES AT A UNIFORM THICKNESS

(75) Inventors: Ryoji Hagiwara, Chiba (JP); Tomokazu Kozakai, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 21 days.

(21) Appl. No.: 10/016,830

(22) Filed: Dec. 13, 2001

(65) Prior Publication Data

US 2002/0177055 A1 Nov. 28, 2002

(30) Foreign Application Priority Data

Dec. 14, 2000 (JP) ........................................ 2000-380718

(51) Int. Cl.⁷ ................................................ G03F 9/00
(52) U.S. Cl. ........................ 430/30; 430/296; 430/942
(58) Field of Search ........................... 430/30, 296, 942

(56) References Cited

U.S. PATENT DOCUMENTS 6,274,290 B1 * 8/2001 Veneklasen et al. ........ 430/296

FOREIGN PATENT DOCUMENTS

TW 0368691 9/1999

* cited by examiner

*Primary Examiner*—Christopher G. Young
(74) *Attorney, Agent, or Firm*—Adams & Wilks

(57) ABSTRACT

In the processing method of the present invention, there is implemented irradiation with a charged particle beam in such a manner that, when executing processing in a uniform manner, when deposition processing or etching processing of a prescribed pattern is carried out using a charged particle beam apparatus, a region of the pattern to be processed is divided up into microscopic regions corresponding to the diameter of the beam, and regulation is performed by scanning circuits etc. with processing proceeding simultaneously for a plurality of patterns within the scanning region in such a manner that the dose amount for each microscopic region becomes equal.

20 Claims, 4 Drawing Sheets

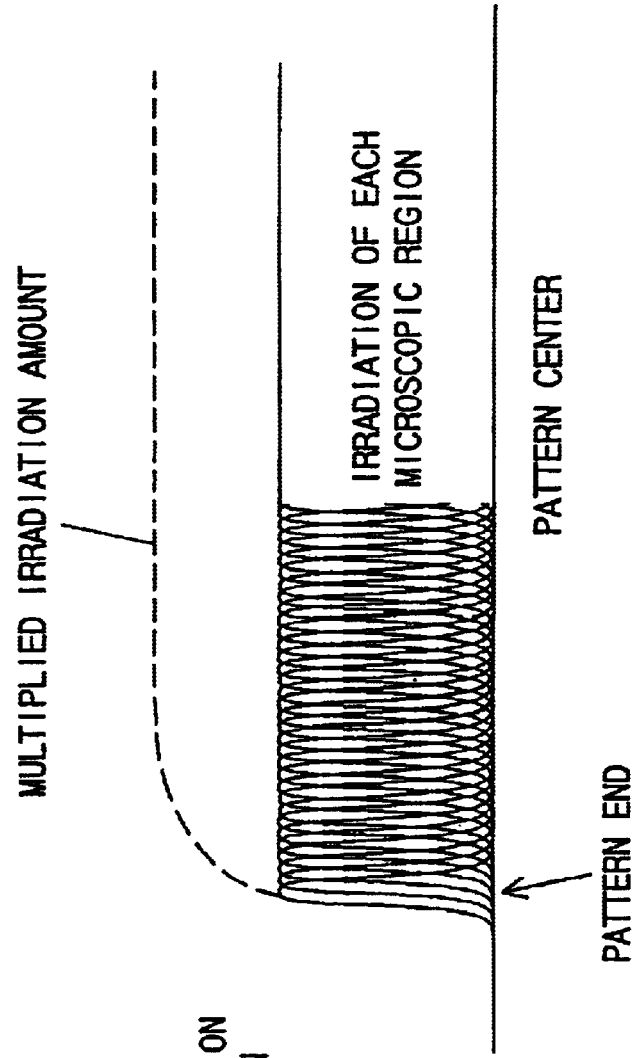
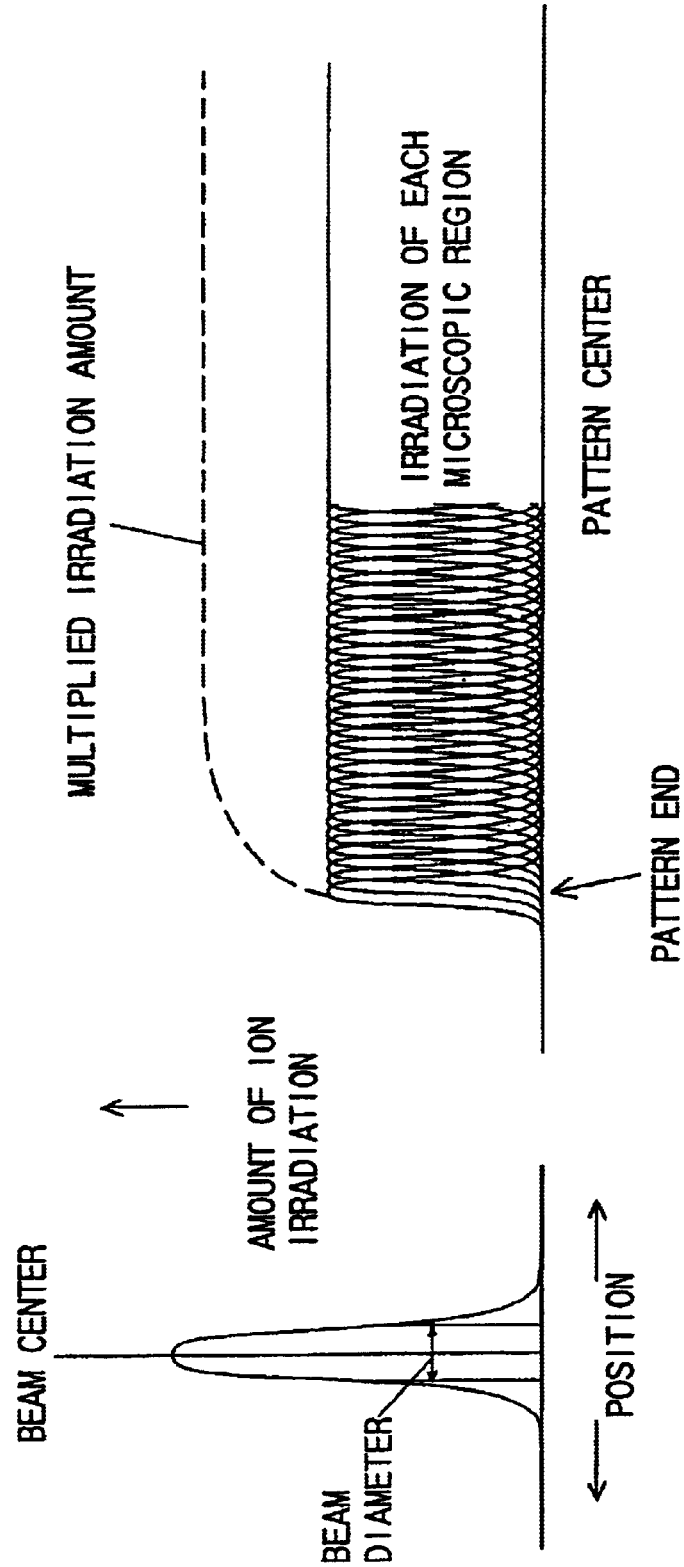
FIG. 1A
FIG. 1B

CHARGED PARTICLE PROCESSING FOR FORMING PATTERN BOUNDARIES AT A UNIFORM THICKNESS

BACKGROUND OF THE INVENTION

The present invention relates to thin-film deposition and etching processing employing focused beams of charged particles such as ions and electrons.

Focused ion beam processing where a hole of a prescribed shape is made in a sample surface and deposition is carried out by blowing source gas out from a gas gun while irradiating a focused ion beam, and which is achieved through sputter-etching or gas-assisted etching employing the kind of focused ion beam apparatus shown in FIG. 4 is widely implemented with respect to photomasks of semiconductor devices, etc.

In the drawings, numeral 1 indicates an ion source. Ions are extracted by applying a voltage to electrodes taken from this ion source 1 and these ions are brought into a beam-shape by an ion optical system 3, are deflected by a deflection operation of a deflector, and are made to irradiate desired locations of a sample 9.

Source gas is blown or injected from a gas gun 6 in the direction of the vicinity of the surface of the sample 9 to be subjected to deposition mounted on a sample stage 7 in the case of processing by deposition.

In doing so, the region of the sample 9 has an atmosphere of the blown source gas so that when a focused ion beam 2 is irradiated, ions and the source gas react with each other so that a certain product material, i.e. a volatile product material, is deposited on the surface of the sample.

When the focused ion beam 2 is made to scan a prescribed region of the sample 9 by the deflector, deposited matter forms a thin film at this region.

In the case of processing employing sputtering etching, when an ion beam is deflected by the deflector 4 in such a manner as to scan a specific region of the sample 9, ions collide with the surface of this region of the sample and material at the surface is detached so as to be scattered.

This process can therefore shave off specific locations. In gas-assisted etching where gases such as halogens are blown out from a gas gun 6 onto a region of the sample to be irradiated where an ion beam is irradiated, ions collide with the surface of the sample at specified regions of irradiation, displaced sample material reacts with an assist gas and is made volatile.

This process has the advantage of the processing speed being rapid at each stage compared with sputter etching that performs simple physical removal because the sample material actively eliminates volatility.

However, when a film-forming process is to be implemented on a certain pattern, when a region to be irradiated of the pattern is set and deposition is implemented, the thickness of portions at the periphery of the pattern becomes thin even if the ion beam acceleration voltage and bean current is kept constant and the number of scans is the same.

Further, when a process is to be performed where a hole is to be made in the pattern at the sample surface, a region of the pattern to be irradiated is set and patterning is performed, and even if the ion beam acceleration voltage and beam current is kept constant and the number of scans is the same, portions at the periphery of the pattern tend to be formed so as to be inclined in an obtuse manner.

Exactly the same can also be said for gas-assisted etching. The cause of this phenomena is that the focused ion beam, rather than being uniform in ion density, has the kind of normal ion distribution shown in FIG. 1A.

The scanning of a focused ion beam having this kind of normal distribution in one direction will now be considered.

After irradiating a certain point a for a fixed period of time, the focused ion beam is shifted in one direction by an interval corresponding to the diameter of the beam, and irradiation is executed for the same time. The beam is then shifted again in the same direction by an interval corresponding to the beam diameter, and irradiation is performed for the same period of time.

This operation is then sequentially repeated until a point b is reached.

The focused ion beam has an ion density distribution that has a normal distribution. This means that there is already some irradiation present even when the beam center is not present at a certain point, i.e. at the time when the beam center approaches in the next step or in a still further step.

The extent to which a certain point is therefore irradiated by an ion beam is therefore an estimated amount including when the center of the beam is not present at this point and when the beam is in the vicinity of this point.

This is shown in graphical form in FIG. 11. Here, a solid line shows the amount of ion irradiation when the beam center is at each point and a dashed line shows an estimated amount of ion irradiation after scanning.

The estimated amount of ion irradiation in the vicinity of the start point of scanning colliding with the end part of the pattern is low compared with that at the central part.

The same can also be said for the vicinity of each scanning end point and pattern end point.

This phenomena occurs not just for cases where ion beam irradiation scanning is performed in steps but also for sequential scanning in analog systems.

Further, the boundary is not limited to the scanning direction and also applies to boundaries between scanning lines, which gives rise to two-dimensional phenomena.

Eventually, this influence appears as blunting of the peripheral portions of the pattern in the previously mentioned deposition and etching processes.

When processing parts of large patterns, the ratio of parts at the boundary periphery is low and processing is therefore relatively uniform. However, for small patterns, the ratio of parts at the boundary periphery is high and processing therefore becomes insufficient.

This situation is shown in FIGS. 2A and 2B taking an example of deposition processing.

In FIG. 2A, there is shown a small pattern a, and a large pattern b.

A large portion of the small pattern is subjected to the influence of blunting at the peripheral portion of the pattern and is therefore constituted by a thinly applied region. However, with the large pattern, a thinly applied region subjected to blunting at the periphery of the pattern is small and is therefore constituted by a thickly applied region.

Cross-sections of each of the portions shown in I to IV of FIG. 2A are shown in FIG. 2B.

Here, cross-sectional thickness corresponds to the amount of irradiation with an ion beam.

As a result, with deposition and etching processing employing a focused ion beam apparatus of the related art, in order to process a pattern to a uniform thickness or a uniform depth, scanning time is changed for large patterns and small patterns.

This then results in an ineffective process where a scanning region is set for every pattern and individual processing is carried out even for ranges where beam scanning is possible.

In order to resolve the aforementioned problems, it is an object of the present invention to provide a processing method and device thereof capable of processing in a uniform manner so that deficiencies in the pattern boundary regions do not occur while at the same time enabling simultaneous processing of a plurality of patterns when performing deposition processing or etching processing on a prescribed pattern using a focused ion beam apparatus.

SUMMARY OF THE INVENTION

In the processing method of the present invention, there is implemented irradiation with a charged particle beam in such a manner that, when executing processing in a uniform manner, when deposition processing or etching processing of a prescribed pattern is carried out using a charged particle beam apparatus, a region of the pattern to be processed is divided up into microscopic regions having a size corresponding to the diameter of the beam, such that when the beam irradiates a respective microscopic region it also irradiates portions of adjacent microscopic regions, and regulation is performed by scanning circuits etc. with processing proceeding simultaneously for a plurality of patterns within the scanning region in such a manner that the dose amount for each microscopic region becomes equal.

BRIEF DESCRIPTION OF THE DRAWINGS

FIG. 1A is a view illustrating ion density distribution of a focused ion beam and FIG. 1B is a view illustrating multiplication of the amount of irradiation applied from the edges of the pattern to the central part.

| [Description of the Numerals] | | | |
|---|---|---|---|
| 1 | ion source | 10 | computer |
| 2 | ion beam | 11 | display |
| 3 | ion optical system | 12 | input operation unit |
| 4 | deflector | | region models A to I |
| 5 | secondary charged particle detector | | |
| 6 | gas gun | | |
| 7 | sample stage | | |
| 2 | sample | | |

DETAILED DESCRIPTION OF THE INVENTION

The present invention resolves the phenomena where the amount of irradiation at portions at the pattern boundary is low compared to the central parts of the processed pattern due to irradiation of ions to a microscopic region within the scanning region of the ion beam also being carried out when the ion beam center is not present in the microscopic region. Here, the basic technological conception is that regulation is carried out in such a manner that the same amount of irradiation is applied to the central portions as to the boundary portions of the pattern in order to bring about uniform processing.

This amount of irradiation is referred to as the dose amount and is determined by the product of ion beam intensity (density) and irradiation time.

The strength of the ion beam depends on the acceleration voltage and beam current; and if this is stable, this is a physical quantity corresponding to irradiation time.

At the focused ion beam apparatus, the dose amount can be determined by setting acceleration voltage, beam current and scanning speed, under the condition that these are taken to be fixed.

Uniform processing can therefore be achieved by having a higher scanning frequency at the boundary portion of the processing pattern compared to the central portion.

Figure 2A:
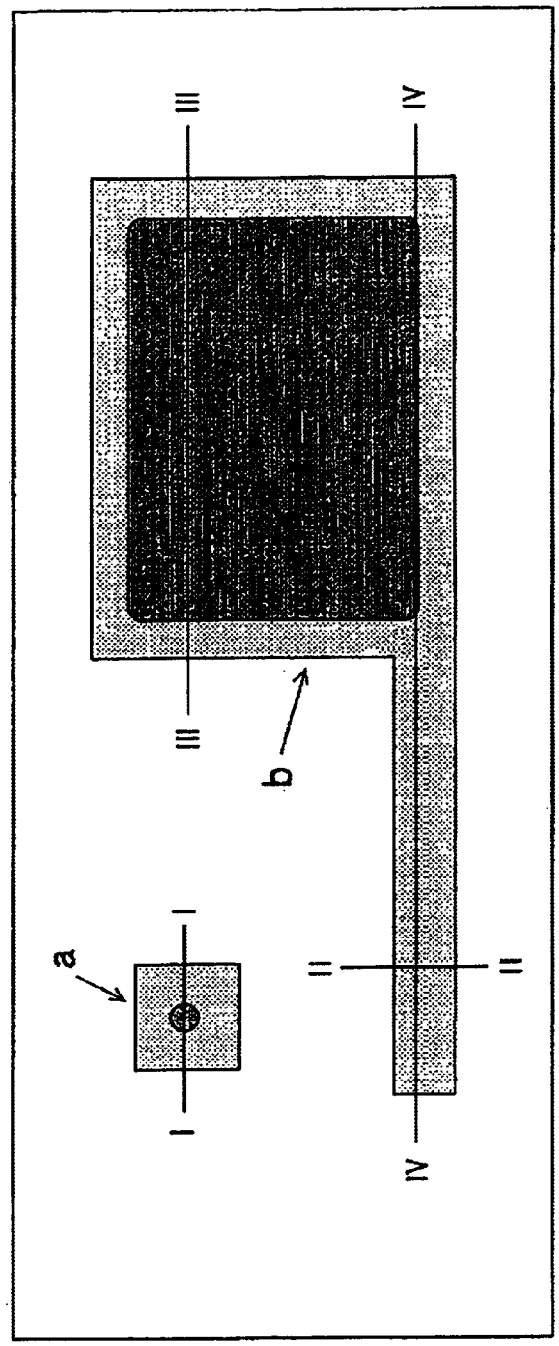
FIG. 2A is a view illustrating the processing state for a large processing pattern and a small processing pattern.

It is now taken that uniform processing of the pattern shown in FIG. 2A is executed.

In FIG. 2A, "a" is an isolated microscopic pattern, and "b" is large pattern having a narrow zone or portion.

Taking this pattern processing to be executed on the sample surface, the processing region is divided up into microscopic regions corresponding to the diameter of the focused ion beam of, for example, 0.2 $\mu$m×0.2 $\mu$m blocks.

Figure 2B:
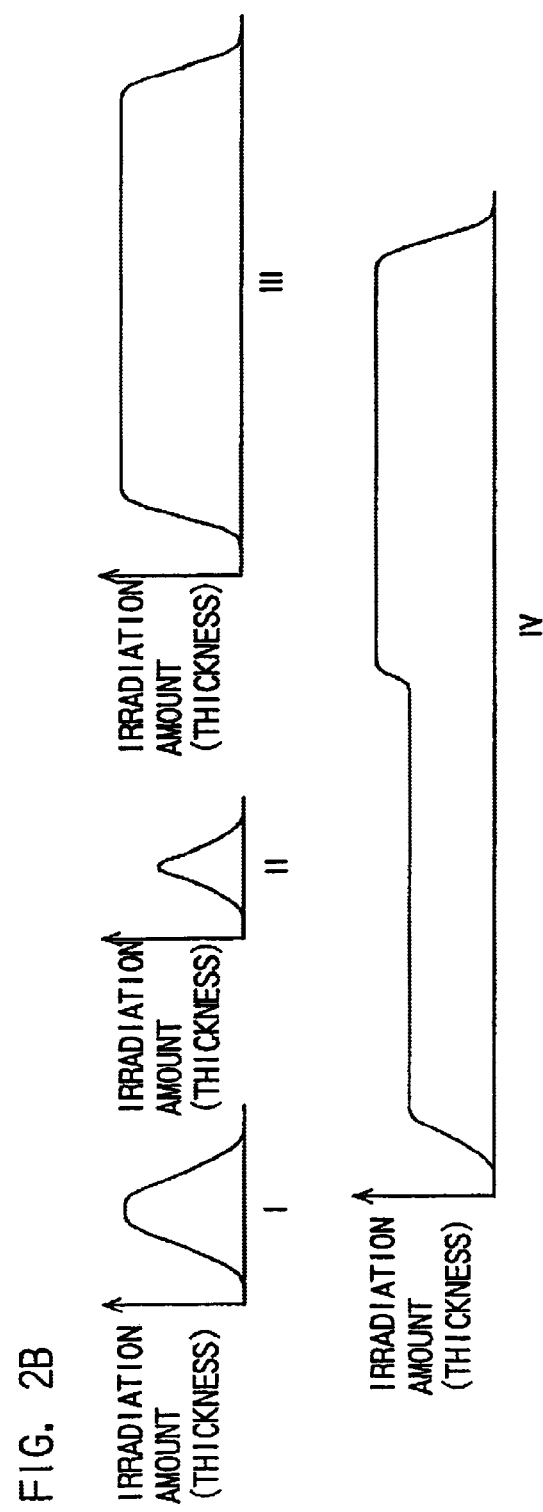
FIG. 2B is a view showing a cross-section for processing of specific locations occurring in FIG. 2A.

Comparing the ion dose amount for the individually divided microscopic regions when executing beam scanning at a designated pattern region, a value for the dose amount at peripheral parts of the pattern boundaries shown as thinly applied regions in FIGS. 2A and 2B is lower than a value at the central parts (shown as thickly applied regions). In the present invention, the scanning frequency is adjusted so that the dose amount becomes the same as for at the center for regions where the dose amount is insufficient. However, this differs depending on the extent of dosage insufficiency of each microscopie region of the plural regions for which the dose is insufficient and also depends on where the region is positioned on the pattern.

Next, the relationship between the position of the microscopic region on the pattern and the dose amount in this case is examined. It can be considered that this phenomena can be simplified by considering that the irradiation only influences the neighboring region, with the influence of irradiation of neighboring 3×3 regions then being taken into consideration taking the noted region as center.

There is therefore 70% ion irradiation at regions where the center of the beam is present, 5% ion radiation at neighboring regions above and below, and to the left and right, and 2.5% ion irradiation at regions neighboring at an angle.

Figure 3:
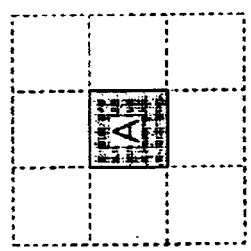
FIG. 3 is a view illustrating each kind of region model of the present invention.
Figure 3:
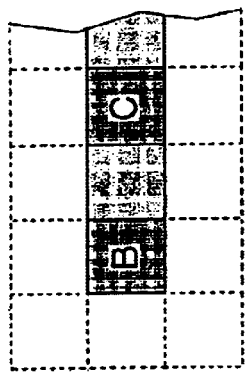
Figure 3:
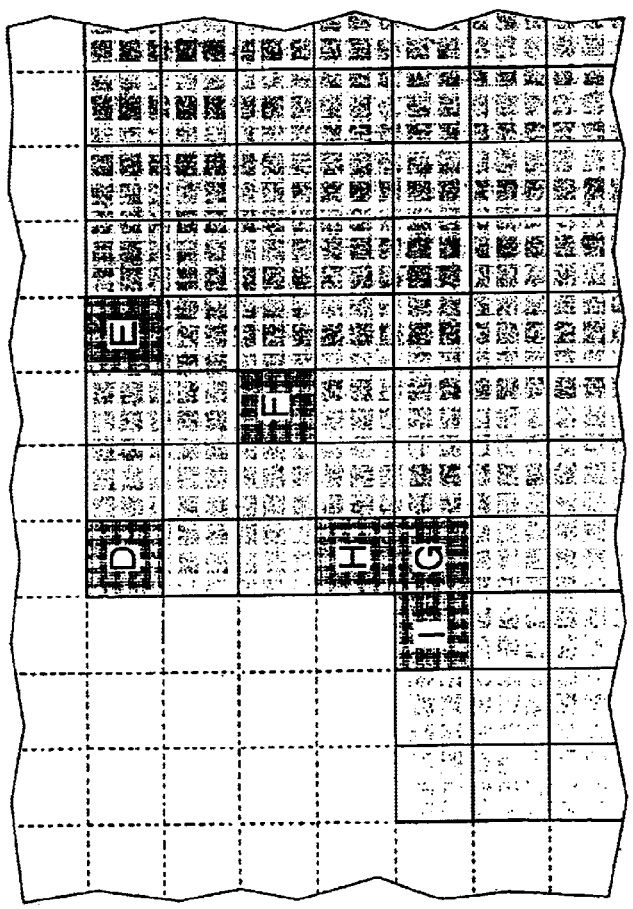

In FIG. 3, box portions shown by the solid lines are pattern portions, and boxes shown by the dashed lines are un-patterned parts of the sample surface.

Here, model A is an isolated region but in this case, this region is only subjected to irradiation by the ion beam when the center of the beam is present in this region. There is therefore no ion irradiation when the beam center is at the eight surrounding regions and therefore only 70% of the ions are irradiated.

Here, model B is a line end region and irradiation by the ion beam takes place when the beam center is present at this region and when the center of the beam is at the right region, which means that 70%+5%=75% ion irradiation takes place.

Further, model C is a linear region and irradiation by the ion beam takes place when the beam center is present at this region and when the beam center is at the left and right regions, which means that 70%+5%×2=80% ion irradiation takes place.

Model D is a corner region and irradiation by the ion beam takes place when the beam center is present at this region and when the center of the beam is at a region at an angle inclined downwards towards the right, which means that 70%+5%×2+2.5%=82.5% ion irradiation takes place.

Model E is a side region. In this case, irradiation by the ion beam takes place when the beam center is present at this region and when the center of the beam is to the left, to the right, downwards, and at a region at an angle inclined downwards towards the right and towards the left, which means that 70%+5%×3+2.5%×2=90% ion irradiation takes place.

Model F is a central region. In this case, irradiation by the ion beam takes place when the beam center is present at this region and when the center of the beam is to the left, to the right, downwards, above, and at a region at an angle inclined towards the upper left, the lower left, the upper right and the lower right, which means that 70%+5%×4+2.5%×4=100% ion irradiation takes place.

Model G is a curved region that is only irradiated with an ion beam for a single inclined region as with the E model, and is therefore irradiated by 70%+5%×4+2.5%×3=97.5%.

The H model is a region neighboring a curved part. In this case, there is no ion beam irradiation for one region neighboring to the (upper) left and one inclined region, and there is therefore ion irradiation of 70%+5%×3+2.5%×3=92.5%.

Conditions for the I model are the same as for the H model. Processing is performed in such a manner as to ensure that a dose amount estimated using a scanning circuit etc. becomes equal so as to take into consideration insufficiency in a dose amount when the models A to H are applied to each microscopic region of the processed pattern region for comparison with the central region.

The ion beam processing of the present invention divides the region to be scanned into microscopic regions corresponding to the beam diameter and the required number of scans is carried out on the individual regions. Scanning is therefore carried out regardless of the size of pattern regions which was the case in the related art. It is therefore not necessary to individually execute processing of a plurality of patterns at scannable regions. This means that processing can be performed at the same time even when the processing thickness (depth) differs between patterns, to provide a superior processing efficiency.

In the above description, a simple example is given where only the influence of the irradiation of 3×3 neighboring regions is taken into consideration taking a noted region as center. However, in reality, finer grained uniformity is possible by achieving compatibility using various models taking into consideration 5×5 or 7×7 regions.

In the above, an example of a focused ion beam is given as a charged particle beam but the present invention is by no means limited in this respect and may also be applied to processing employing electron beams.

Embodiment 1

Figure 4:
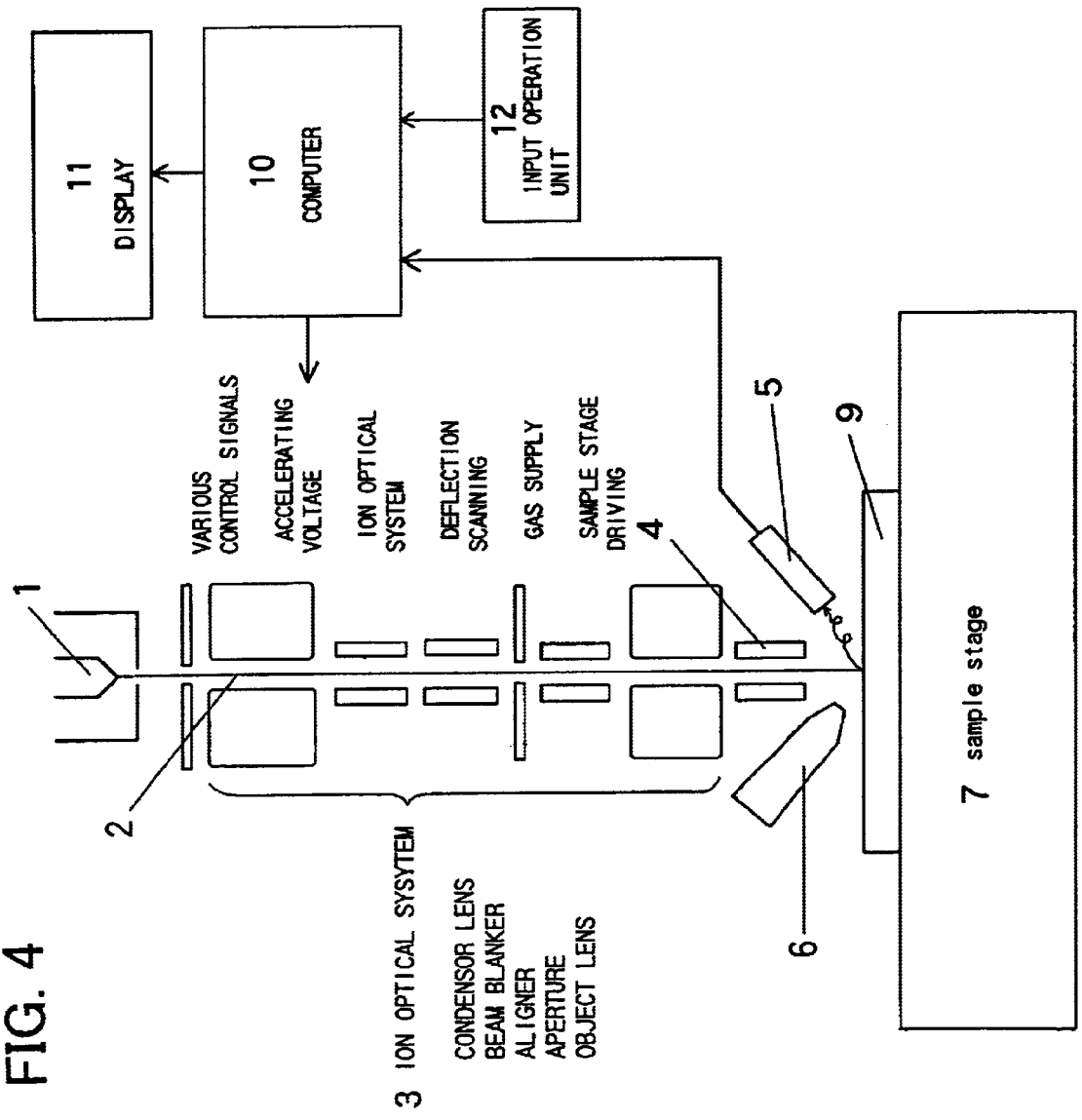
FIG. 4 is a view showing the basic structure of a focused ion beam apparatus used in the present invention.

An embodiment of a focused ion beam deposition system adopting the method of the present invention will now be described with reference to FIG. 4. First, the sample to be processed 9 is mounted on a sample stage 7 and the surface of the sample 9 is scanned with an ion beam 2. Expelled secondary charged particles are then detected by a secondary charge particle detector 5 and a microscopically observed image is displayed on a display 11.

Locations to be processed are then specified on the screen and a design image for the processed pattern is superimposed on the display.

Next, the pattern to be processed is divided into microscopic regions corresponding to the diameter of the ion beam and models are allotted to each section corresponding to the pattern. A description is now given where the simple model described above for A to H is allotted.

With a pattern where a single corner and another corner face each other, the D model is allotted to the patterns for the corners and the edge part E model is allotted to the part between the corners.

Further, with edges corresponding to corner parts and curved parts, the D model is allotted to corner parts, the H model is allotted to regions neighboring curved regions, the G model is allotted to the curved parts, and the model E is allotted to edge parts therebetween.

The F model is then collectively allotted to the central region where there is no influence of the boundary.

In reality, the beam irradiation does not just influence the neighboring region but does in fact influence a broader region. Each model other than that for the central region is then grouped together into a plurality of sections from the boundary region to the central region and stored in advance in a ROM within the computer 10 as information.

This model allotting operation is prepared as support software in the ROM within the computer 10. An input operation unit 12 such as a keyboard etc. is then operated and specific points such as angular parts and curved parts etc. of the design pattern are then specified on the display 11. Edge part models are then allotted therebetween and the remaining regions are determined to be central regions and automatically have models allotted.

This allotted information is then stored as mapping information in the RAM of the computer 10.

At the stage at which this information is obtained, when source gas is sprayed from the gas gun 6, irradiation scanning of the ion beam 2 on the pattern region commences and processing is executed.

When the central region reaches the desired stage in the processing, beam irradiation to the regions is halted but ion beam irradiation of parts of the region (just the peripheral regions) that are deemed not to have been sufficiently irradiated continue to be irradiated based on the map information.

Sequential ion beam irradiation is then halted when the amount of irradiation (dose amount) of that region becomes the same as that for the central region.

With the halting of this irradiation, the beam is swung to outside of the aperture so as to be cut by the blanker of the ion optical system 3 when the scanning position is rotated about the aforementioned region.

Processing is then complete when all of the partitioned microscopic regions within the processing pattern are irradiated with the prescribed dose.

In the present invention, there is provided a processing method for implementing irradiation with a charged particle beam in such a manner that, when deposition processing or etching processing of a prescribed pattern is carried out using a charged particle beam apparatus, a region of the pattern to be processed is divided up into microscopic regions corresponding to the diameter of the beam, the dose amount for each microscopic region becomes equal as a result of regulating the scanning frequency, etc. This causes the charged particle density of the beam to have a normal distribution and means that processing deficiencies that occurred at the peripheral parts of the pattern can be corrected.

As beam irradiation can be controlled for individual regions based on information for each microscopic region divided so as to correspond to beam diameter, processing of a plurality of patterns within a scannable region can be carried out simultaneously for large patterns or small patterns so that extremely effective processing can be implemented.

What is claimed is:

1. A charged particle beam processing method comprising the steps of:
   dividing a pattern to be processed by a charged particle beam into a plurality of microscopic regions each having a size set such that when the charged particle beam irradiates a respective microscopic region it also irradiates portions of adjacent microscopic regions;
   scanning the charged particle beam across the pattern; and
   varying a frequency of the scanning so that each of the respective microscopic regions has an equal dose of irradiation applied thereto by the charged particle beam.

2. A charged particle beam processing method according to claim 1; wherein the step of varying a frequency of the scanning is performed so that microscopic regions at boundary portions of the pattern are irradiated by the charged particle beam for a longer period of time than microscopic regions at interior portions of the pattern.

3. A charged particle beam processing method according to claim 1; wherein the pattern comprises a plurality of individual patterns within a scanning region of the charged particle beam; and the steps of scanning the charged particle beam and varying a frequency of the scanning are performed simultaneously on each of the individual patterns.

4. A charged particle beam processing method according to claim 1; further comprising the step of injecting a deposition gas while scanning the charged particle beam across the pattern to deposit a material on the pattern.

5. A charged particle beam processing method according to claim 1; wherein the charged particle beam is a focused ion beam.

6. A charged particle beam processing method comprising the steps of:
   dividing a pattern to be processed by a charged particle beam into a plurality of microscopic regions each having a size set such that when charged particle beam irradiates a respective microscopic region it also irradiates portions of adjacent microscopic regions;
   determining irradiation amount distribution information for each respective microscopic region necessary to obtain the same irradiation amount for each microscopic region; and
   scanning the charged particle beam across the pattern based on the irradiation amount distribution information.

7. A charged particle beam processing method according to claim 6; wherein the step of determining irradiation amount distribution information for each respective microscopic region comprises the step of determining an irradiation amount for each microscopic region based upon a relative location thereof in the pattern.

8. A charged particle beam processing method according to claim 7; wherein the step of determining an irradiation amount for each respective microscopic region comprises the step of determining a number of microscopic regions directly adjacent thereto within the pattern.

9. A charged particle beam processing method according to claim 7; further comprising the step of varying a frequency of the scanning so that microscopic regions at boundary portions of the pattern are irradiated by the charged particle beam for a longer period of time than microscopic regions at interior portions of the pattern.

10. A charged particle beam processing method according to claim 9; wherein the step of varying a frequency of the scanning comprises the step of irradiating microscopic regions having a smaller number of directly adjacent microscopic regions for a longer period of time than those which have a larger number of directly adjacent microscopic regions.

11. A charged particle beam processing method according to claim 9; further comprising the step of storing a plurality of different microscopic region models each containing a charged particle beam irradiation amount and a different number of directly adjacent microscopic regions within a pattern.

12. A charged particle beam processing method according to claim 9; wherein the step of determining an irradiation amount for each respective microscopic region comprises the step of comparing each microscopic region to the stored models.

13. A charged particle beam processing method according to claim 6; wherein the pattern comprises a plurality of individual patterns within a scanning region of the charged particle beam; and the step of scanning the charged particle beam is performed simultaneously on each of the individual patterns.

14. A charged particle beam processing method according to claim 6; further comprising the step of injecting a deposition assist gas while scanning the charged particle beam across the pattern to deposit a material on the pattern.

15. A charged particle beam processing method according to claim 6; wherein the charged particle beam is a focused ion beam.

16. A charged particle beam processing method comprising the steps of:
   dividing at least one pattern to be processed in a scanning region of a charged particle beam into a plurality of microscopic regions each having a size set such that when the charged particle beam irradiates a respective microscopic region it also irradiates portions of adjacent microscopic regions;
   storing irradiation amount distribution information for the microscopic regions corresponding to relative positions of the microscopic regions within the at least one pattern;
   comparing the respective microscopic regions to the stored information; and
   scanning the at least one pattern with the charged particle beam based on results of the comparisons.

17. A charged particle beam processing method according to claim 16; wherein the step of comparing the respective microscopic regions to the stored information is performed while displaying the microscopic regions on a display screen.

18. A charged particle beam processing method according to claim 16; wherein the step of storing irradiation amount distribution information for each respective microscopic region comprises the step of storing an irradiation amount for plural different types of microscopic regions each having a different number of directly adjacent microscopic regions within the at least one pattern.

19. A charged particle beam processing method according to claim 16; further comprising the step of varying a frequency of the scanning so that microscopic regions at boundary portions of the at least one pattern are irradiated by the charged particle beam for a longer period of time than microscopic regions at interior portions of the at least one pattern.

20. A charged particle beam processing method according to claim 19; wherein the step of scanning the at least one pattern comprises the step of irradiating microscopic regions having a smaller number of directly adjacent microscopic regions for a longer period of time than those which have a larger number of directly adjacent microscopic regions.

* * * * *